United States Patent
Kwon

(10) Patent No.: US 9,064,588 B1
(45) Date of Patent: Jun. 23, 2015

(54) SEMICONDUCTOR DEVICES INCLUDING E-FUSE ARRAYS

(71) Applicant: SK hynix Inc., Icheon-si, Gyeonggi-do (KR)

(72) Inventor: Ig Soo Kwon, San Ramon, CA (US)

(73) Assignee: SK Hynix Inc., Gyeonggi-do (KR)

( * ) Notice: Subject to any disclaimer, the term of this patent is extended or adjusted under 35 U.S.C. 154(b) by 21 days.

(21) Appl. No.: 14/174,566

(22) Filed: Feb. 6, 2014

(51) Int. Cl.
    *G11C 5/14* (2006.01)
    *G11C 17/16* (2006.01)
    *G11C 7/06* (2006.01)
    *G11C 7/22* (2006.01)

(52) U.S. Cl.
    CPC ............... *G11C 17/16* (2013.01); *G11C 7/065* (2013.01); *G11C 5/148* (2013.01); *G11C 7/22* (2013.01); *G11C 5/147* (2013.01)

(58) Field of Classification Search
    CPC .......... G11C 17/12; G11C 17/16; G11C 7/22; G11C 7/1051; G11C 7/1078; G11C 7/1006; G11C 5/147; B82Y 10/00
    USPC ................. 365/94, 96, 129, 189.011, 189.15, 365/189.16, 189.17, 189.07, 189.09, 189.12
    See application file for complete search history.

(56) References Cited

U.S. PATENT DOCUMENTS

| | | | | |
|---|---|---|---|---|
| 6,072,742 A | * | 6/2000 | Ooishi | ........................ 365/226 |
| 6,347,029 B1 | * | 2/2002 | Ouyang et al. | ............... 361/93.9 |
| 6,424,585 B1 | * | 7/2002 | Ooishi | ........................... 365/226 |
| 2011/0062996 A1 | | 3/2011 | Chang et al. | |

FOREIGN PATENT DOCUMENTS

KR     1020030085237 A     11/2003

* cited by examiner

*Primary Examiner* — Fernando Hidalgo
(74) *Attorney, Agent, or Firm* — William Park & Associates Ltd.

(57) ABSTRACT

The semiconductor device includes a start signal generation circuit and a boot-up operation circuit. The start signal generation circuit detects a level of an external voltage signal to generate a pre-detection signal; executes a differential amplification operation of a voltage difference between the external voltage signal and a reference voltage signal to generate a first detection signal; detects a level of an internal voltage signal to generate a second detection signal, and generates a start signal in response to the first and second detection signals. The boot-up operation circuit executes a boot-up operation in response to the start signal.

20 Claims, 7 Drawing Sheets

SEMICONDUCTOR DEVICES INCLUDING E-FUSE ARRAYS

BACKGROUND

1. Technical Field

Embodiments of the present disclosure relate to semiconductor devices.

2. Description of Related Art

Semiconductor devices may include fuses that store information necessary for various internal control operations, for example, setup information, repair information or the like. General fuses can be programmed in a wafer level because a logic level of each data is determined according to an electrical open/short state of each fuse. However, once the semiconductor devices are encapsulated to form semiconductor packages, it may be impossible to program the general fuses in the semiconductor packages. E-fuses are widely used to solve the aforementioned disadvantage. Each of the e-fuses may be realized using a transistor, for example, a nonvolatile memory (NVM) cell transistor having a floating gate or a charge trapping layer. In such a case, a data may be stored in the e-fuse by programming or erasing the transistor to change a threshold voltage of the transistor. That is, the e-fuse may be electrically open or short according to a resistance value between a source and a drain of the transistor employed as the e-fuse.

In order to correctly recognize the data stored in the e-fuses, a size of the transistors employed as the e-fuses has to be increased or amplifiers have to be used without increasing the size of the transistors employed as the e-fuses. However, in any case, there may be limitations in increasing the integration density of the semiconductor devices including the e-fuses.

Recently, e-fuse arrays have been proposed to solve the limitations of the integration density and to store the information necessary for various internal control operations. In the event that the e-fuse arrays are employed in the semiconductor devices, the e-fuse arrays may share the amplifiers with each other. Accordingly, the integration density of the semiconductor devices may be improved.

SUMMARY

Various embodiments are directed to semiconductor devices.

According to various embodiments, a semiconductor device includes a start signal generation circuit and a boot-up operation circuit. The start signal generation circuit detects a level of an external voltage signal to generate a pre-detection signal and executes a differential amplification operation of a voltage difference between the external voltage signal and a reference voltage signal to generate a first detection signal. Further, the start signal generation circuit detects a level of an internal voltage signal to generate a second detection signal and generates a start signal in response to the first and second detection signals. The boot-up operation circuit executes a boot-up operation in response to the start signal. The boot-up operation transmits control data internally generated to a first data latch unit and a second data latch unit.

According to various embodiments, a semiconductor device includes an external voltage detector suitable for detecting a level of an external voltage signal to generate a pre-detection signal, a reference voltage generator suitable for generating a reference voltage signal in response to the pre-detection signal, a differential amplifier suitable for executing a differential amplification operation between the external voltage signal and the reference voltage signal to generate a first detection signal, an internal voltage detector suitable for detecting a level of an internal voltage signal to generate a second detection signal, and a signal synthesizer suitable for generating a start signal in response to the first and second detection signals.

In an embodiment, a system includes: a processor; a controller suitable for receiving a request and a data from the processor; and a memory unit suitable for receiving the request and the data from the controller, wherein the controller includes: a start signal generation circuit suitable for detecting a level of an external voltage signal to generate a pre-detection signal, execute a differential amplification operation of a voltage difference between the external voltage signal and a reference voltage signal to generate a first detection signal, detect a level of an internal voltage signal to generate a second detection signal, and generate a start signal in response to the first and second detection signals; and a boot-up operation circuit suitable for executing a boot-up operation in response to the start signal, wherein the boot-up operation transmits control data internally generated to a first data latch unit and a second data latch unit.

BRIEF DESCRIPTION OF THE DRAWINGS

Embodiments of the invention will become more apparent in view of the attached drawings and accompanying detailed description, in which.

DETAILED DESCRIPTION OF THE EMBODIMENTS

Embodiments of the invention will be described hereinafter with reference to the accompanying drawings. However, the embodiments described herein are for illustrative purposes only and are not intended to limit the scope of the invention.

Figure 1:
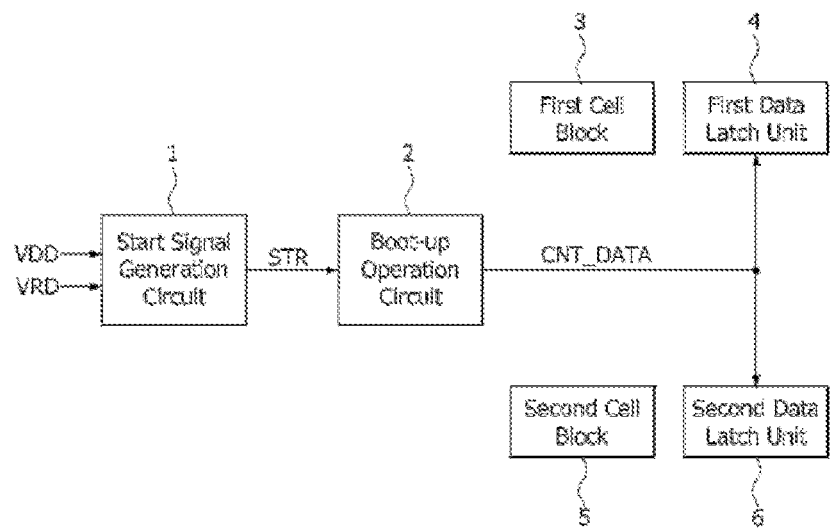
FIG. 1 is a block diagram illustrating a semiconductor device according to an embodiment of the invention.

Referring to FIG. 1, a semiconductor device according to an embodiment may include a start signal generation circuit 1, a boot-up operation circuit 2, a first cell block 3, a first data latch unit 4, a second cell block 5 and a second data latch unit 6.

The start signal generation circuit 1 may detect a level of an external voltage signal VDD supplied from an external device and a level of an internal voltage signal VRD to generate a start signal STR. In more detail, the start signal generation circuit 1 may generate the start signal STR which is enabled when a level of the external voltage signal VDD and a level of the internal voltage signal VRD reach a first predetermined level and a second predetermined level respectively.

The boot-up operation circuit 2 may execute a boot-up operation in response to the start signal STR. The boot-up operation may correspond to an operation that control data CNT_DATA generated from the boot-up operation circuit 2 are transmitted to the first data latch unit 4 and the second data latch unit 6. The control data CNT_DATA may be stored in an e-fuse array portion (not shown) included in the boot-up operation circuit 2. The control data CNT_DATA may include information for controlling internal operations of the first cell block 3 and information for controlling internal operations of the second cell block 5. The information for controlling the internal operations of the first and second cell blocks 3 and 5 may be repair information or set-up information used in repair operations that replace failed cells in the first and second cell blocks 3 and 5 with redundancy cells. The information for controlling the internal operations of the first cell block 3 may be transmitted to the first data latch unit 4 to be latched, and the information for controlling the internal operations of the second cell block 5 may be transmitted to the second data latch unit 6 to be latched.

Figure 2:
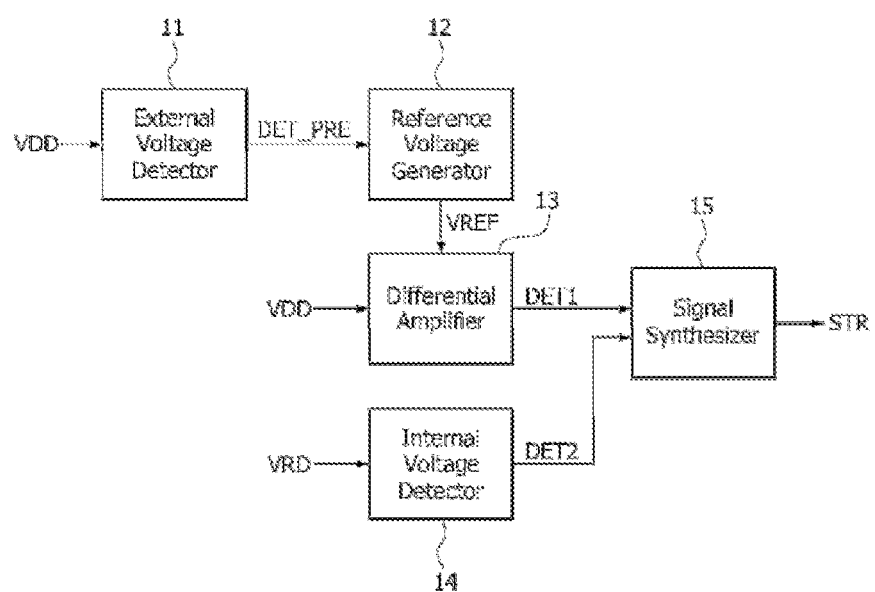
FIG. 2 is a block diagram illustrating a start signal generation circuit included in the semiconductor device of FIG. 1.

Referring to FIG. 2, the start signal generation circuit 1 may include an external voltage detector 11, a reference voltage generator 12, a differential amplifier 13, an internal voltage detector 14 and a signal synthesizer 15.

The external voltage detector 11 may generate a pre-detection signal DET_PRE which is enabled when the external voltage signal VDD has a higher level than a first target level. The external voltage detector 11 may be suitable for detecting a level of the external voltage signal VDD to generate the pre-detection signal DET_PRE. The enabled pre-detection signal DET_PRE may be set to have a logic "high" level or a logic "low" level according to the embodiments.

The reference voltage generator 12 may generate a reference voltage signal VREF when the pre-detection signal DET_PRE is enabled. The reference voltage signal VREF may have a constant level regardless of a process/voltage/temperature (PVT) condition. The reference voltage generator 12 may be realized using a Widlar circuit or the like which generates a constant voltage level.

The differential amplifier 13 may be suitable for executing a differential operation by amplifying a voltage difference between the external voltage signal VDD and the reference voltage signal VREF to generate a first detection signal DET1. The first detection signal DET1 may be enabled from a logic "low" level to a logic "high" level when the external voltage signal VDD has a higher level than the reference voltage signal VREF. However, in various embodiments, a logic level of the first detection signal DET1 enabled may be set to be a logic "low" level.

The internal voltage detector 14 may generate a second detection signal DET2 which is enabled from a logic "low" level to a logic "high" level when the internal voltage signal VRD has a higher level than a second target level. However, in various embodiments, a logic level of the second detection signal DET2 enabled may be set to be a logic "low" level.

The signal synthesizer 15 may generate the start signal STR for executing a boot-up operation which is enabled to have a logic "high" level when both the first and second detection signals DET1 and DET2 are enabled to have a logic "high" level. However, in various embodiments, a logic level of the enabled start signal STR may be set to be a logic "low" level. Further, the boot-up operation transmits control data CNT_DATA to the first data latch unit 4 and the second data latch unit 6.

The start signal STR generated from the start signal generation circuit 1 may be enabled when the external voltage signal VDD has a higher level than the first target level and the reference voltage signal and the internal voltage signal VRD has a higher level than the second target level. The start signal generation circuit 1 may generate the start signal STR by amplifying a voltage difference between the external voltage signal VDD and the reference voltage signal VREF. Thus, even though the external voltage signal VDD includes a noise signal, the start signal generation circuit 1 may stably detect a level of the external voltage signal VDD to generate the start signal STR.

Figure 3:
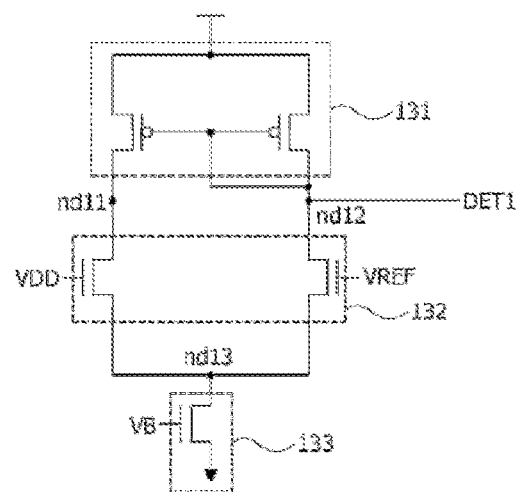
FIG. 3 is a circuit diagram illustrating a differential amplifier included in the start signal generation circuit of FIG. 2.

Referring to FIG. 3, the differential amplifier 13 may include a constant current source 131, a signal input unit 132 and an activation unit 133.

The constant current source 131 may be coupled between a power voltage terminal and nodes ND11 and ND12, and the signal input unit 132 may be coupled between the nodes ND11 and ND12 and a node ND13. Further, the activation unit 133 may be coupled between the node ND13 and a ground voltage terminal.

The constant current source 131 may supply a constant current to nodes ND11 and ND12. The constant current source 131 may be realized using a current mirror circuit. The signal input unit 132 may receive the external voltage signal VDD and the reference voltage signal VREF to set the levels of the nodes ND11 and ND12. The activation unit 133 may discharge electric charges of the node ND13 coupled to the signal input unit 132 in response to a bias voltage signal VB to activate a differential amplification operation of the constant current source 131 and the signal input unit 132.

When the external voltage signal VDD has a lower level than the reference voltage signal VREF, the differential amplifier 13 may amplify a voltage difference between the external voltage signal VDD and the reference voltage signal VREF to set the levels of the node ND11 and the node ND12 to a logic "high" level and to a logic "low" level respectively and may output the signal of the node ND12 having a logic "low" level as the first detection signal DET1. When the external voltage signal VDD has a higher level than the reference voltage signal VREF, the differential amplifier 13 may amplify a voltage difference between the external voltage signal VDD and the reference voltage signal VREF to set the levels of the node ND11 and the node ND12 to a logic "low" level and to a logic "high" level respectively and may output the signal of the node ND12 having a logic "high" level as the first detection signal DET1.

Figure 4:
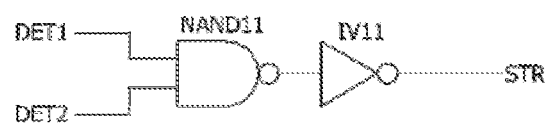
FIG. 4 is a logic circuit diagram illustrating a signal synthesizer included in the start signal generation circuit of FIG. 2.

Referring to FIG. 4, the signal synthesizer 15 may include a NAND gate NAND11 and an inverter IV11 receiving an output signal of the NAND gate NAND11. The signal synthesizer 15 may execute a NAND operation of the first detection signal DET1 and the second detection signal DET2 to generate the start signal STR. The signal synthesizer 15 may generate the start signal STR enabled to have a logic "high" level when both the first and second detection signals DET1 and DET2 are enabled to have a logic "high" level.

Figure 5:
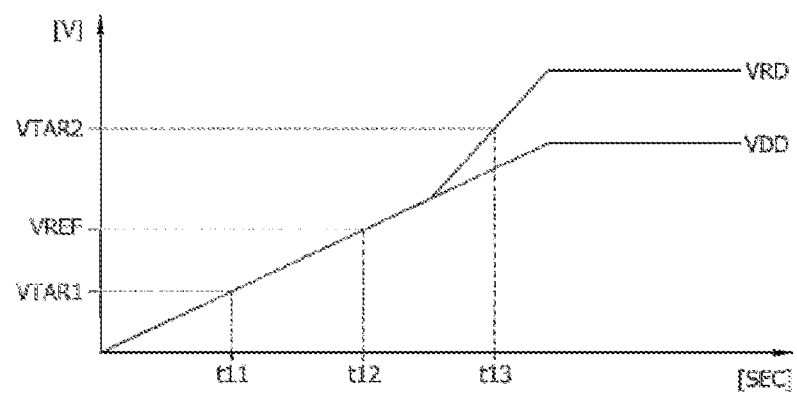
FIG. 5 is a graph illustrating an operation of the start signal generation circuit shown in FIG. 2.

A boot-up operation of the semiconductor device set forth above will be described hereinafter with reference to FIG. 5.

Till a point of time "T11", the external voltage signal VDD may have a lower level than the first target level VTAR1. A second target level VTAR2, and internal voltage signal VRD is also illustrated. IN addition, the voltage [V] and seconds [SEC] is also illustrated in FIG. 5. The pre-detection signal DET_PRE may be generated to be disabled without generation of the reference voltage signal VREF. In such a case, both the first and second detection signals DET1 and DET2 may be disabled to have a logic "low" level. Accordingly, since the start signal STR is disabled to have a logic "low" level, the boot-up operation may not be executed.

During a period from the point of time "T11" to a point of time "T12", the external voltage signal VDD may have a higher level than the first target level VTAR1 and may have a lower level than the reference voltage signal VREF. Thus, the pre-detection signal DET_PRE may be enabled to generate the reference voltage signal VREF. A voltage difference between the external voltage signal VDD and the reference voltage signal VREF is amplified to generate the first detection signal DET1 disabled to have a logic "low" level. The second detection signal DET2 may be disabled to have a logic "low" level. Accordingly, since the start signal STR is disabled to have a logic "low" level, the boot-up operation may not be executed.

During a period from the point of time "T12" to a point of time "T13", the external voltage signal VDD may have a higher level than the reference voltage signal VREF. Thus, the pre-detection signal DET_PRE may be enabled to generate the reference voltage signal VREF. A voltage difference between the external voltage signal VDD and the reference voltage signal VREF is amplified to generate the first detection signal DET1 enabled to have a logic "high" level. The second detection signal DET2 may be enabled to have a logic "high" level. Accordingly, since the start signal STR is enabled to have a logic "high" level, the boot-up operation may be executed. As a result of the boot-up operation, the information included in the control data CNT_DATA to control internal operations of the first cell block 3 may be transmitted to the first data latch unit 4 to be latched, and the information included in the control data CNT_DATA to control internal operations of the second cell block 5 may be transmitted to the second data latch unit 6 to be latched.

As described above, the semiconductor device according to the embodiments may detect a level of the external voltage signal VDD using a differential amplification operation with the reference voltage signal VREF to generate the start signal STR. That is, even though a level of the external voltage signal VDD is lowered due to a noise signal, the level of the external voltage signal VDD may be stably detected using a differential amplification operation to prevent malfunction of the semiconductor device executing a boot-up operation.

Figure 6:
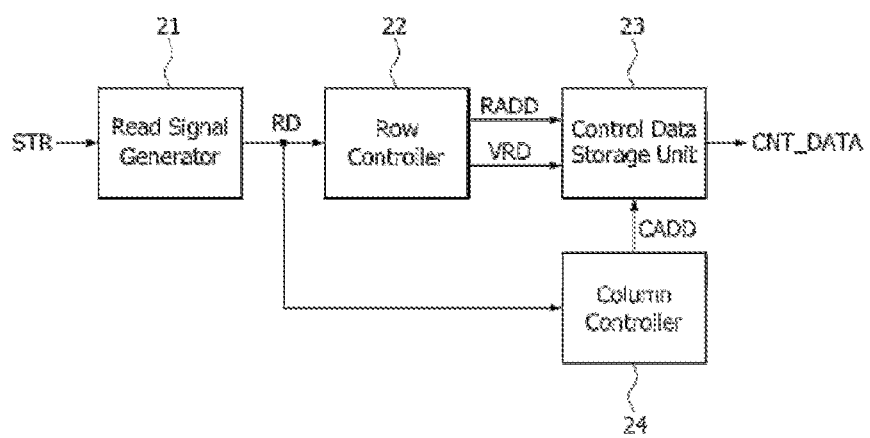
FIG. 6 is a block diagram illustrating a boot-up operation circuit included in the semiconductor device of FIG. 1.

Referring to FIG. 6, the boot-up operation circuit 2 may include a read signal generator 21, a row controller 22, a control data storage unit 23 and a column controller 24. The read signal generator 21 may generate a read signal RD in response to the start signal STR, which is enabled to output the control data CNT_DATA stored in the control data storage unit 23, while the start signal STR is enabled. The row controller 22 may generate a row address signal RADD and an internal voltage signal VRD in response to the read signal RD and in synchronization with the read signal RD and may apply the row address signal RADD and the internal voltage signal VRD to the control data storage unit 23. The column controller 24 may generate a column address signal CADD in response to the read signal RD and in synchronization with the read signal RD and may apply the column address signal CADD to the control data storage unit 23. The control data storage unit 23 may transmit data stored in memory cells (not shown) coupled to a row line (not shown) selected by the row address signal RADD to column lines (not shown) in response to the internal voltage signal VRD and may amplify the data on column lines selected by the column address signal CADD to output the amplified data as the control data CNT_DATA. The memory cells in the control data storage unit 23 may be realized using an e-fuse array. Accordingly, the control data storage unit 23 may be suitable for outputting the control data CNT_DATA in response to the internal voltage signal VRD, the row address signal RADD, and the column address signal CADD.

Figure 7:
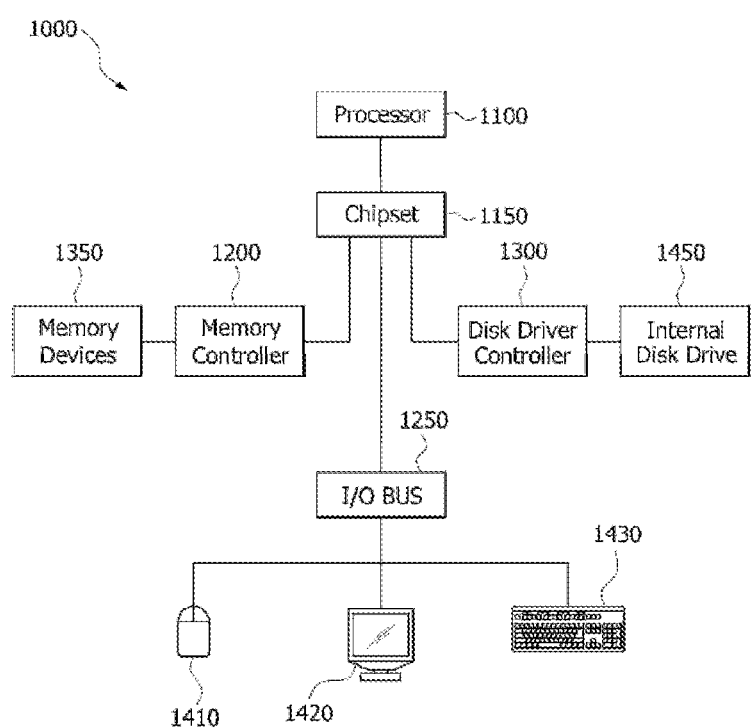
FIG. 7 is a block diagram of a system employing a memory controller circuit in accordance with an embodiment of the invention.

Referring to FIG. 7, a block diagram of a system 1000 employing a memory controller 12000 in accordance with an embodiment of the invention is illustrated. The system 1000 may include one or more processors or central processing units ("CPUs") 1100. The CPU 1100 may be used individually or in combination with other CPUs.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be operably coupled to the chipset 1150. The memory controller 1200 may include the semiconductor device described above; and at least one memory controller which delays the generation of the address signal, blocks consecutive accesses, of which the number exceeds the predetermined critical value, to the same word line or same bit line of a selected memory bank of the memory unit. The memory controller 1200 can receive a request provided from the CPU 1100, through the chipset 1150. The memory controller 1200 may be integrated into the chipset 1140. The memory controller 1200 may be operably coupled to one or more memory devices 1350. The memory devices 1350 may be any one of a number of industry standard memory types, including but not limited to, single inline memory modules ("SIMMs") and dual inline memory modules ("DIMMs"). The memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 may also be operable coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

What is claimed is:

1. A semiconductor device comprising:
  a start signal generation circuit suitable for detecting a level of an external voltage signal to generate a pre-detection signal, executing a differential amplification operation of a voltage difference between the external voltage signal and a reference voltage signal to generate a first detection signal, detecting a level of an internal voltage signal to generate a second detection signal, and generating a start signal in response to the first and second detection signals; and
  a boot-up operation circuit suitable for executing a boot-up operation in response to the start signal,
  wherein the boot-up operation transmits control data internally generated to a first data latch unit and a second data latch unit.

2. The semiconductor device of claim 1, wherein a level of the pre-detection signal is changed when a level of the external voltage signal is higher than a first target level.

3. The semiconductor device of claim 2, wherein the first detection signal is enabled with a level transition when a level of the external voltage signal is higher than a level of the reference voltage signal.

4. The semiconductor device of claim 3, wherein the second detection signal is enabled with a level transition when a level of the internal voltage signal is higher than a second target level.

5. The semiconductor device of claim 4, wherein the start signal is enabled when both the first and second detection signals are enabled.

6. The semiconductor device of claim 1, wherein the start signal generation circuit includes:
   an external voltage detector suitable for generating the pre-detection signal enabled with a level transition when a level of the external voltage signal is higher than a first target level;
   a reference voltage generator suitable for generating the reference voltage signal when the pre-detection signal is enabled;
   a differential amplifier suitable for generating the first detection signal enabled with a level transition when a level of the external voltage signal is higher than a level of the reference voltage signal;
   an internal voltage detector suitable for generating the second detection signal enabled with a level transition when a level of the internal voltage signal is higher than a second target level; and
   a signal synthesizer suitable for generating the start signal enabled when both the first and second detection signals are enabled.

7. The semiconductor device of claim 6, wherein the differential amplifier includes:
   a constant current source suitable for supplying a constant current to a first node and a second node, the first detection signal being outputted through the second node;
   a signal input unit suitable for receiving the external voltage signal and the reference voltage signal to set a level of the first node and a level of the second node; and
   an activation unit suitable for discharging electric charges of a third node coupled to the signal input unit to activate a differential amplification operation.

8. The semiconductor device of claim 1, wherein the control data include information for controlling internal operations of a first cell block and information for controlling internal operations of a second cell block.

9. The semiconductor device of claim 8, wherein the boot-up operation stores the information included in the control data to control the internal operations of the first cell block in the first data latch unit and stores the information included in the control data to control the internal operations of the second cell block in the second data latch unit.

10. The semiconductor device of claim 1, wherein the boot-up operation circuit includes:
    a read signal generator suitable for generating a read signal in response to the start signal;
    a row controller suitable for generating the internal voltage signal and a row address signal in response to the read signal;
    a column controller suitable for generating a column address signal in response to the read signal; and
    a control data storage unit suitable for outputting the control data in response to the internal voltage signal, the row address signal and the column address signal.

11. The semiconductor device of claim 10, wherein the control data storage unit transmits data stored in memory cells in response to the internal voltage signal and amplifies the data to output the amplified data as the control data.

12. The semiconductor device of claim 11, wherein the memory cells are realized using an e-fuse array.

13. A semiconductor device comprising:
    an external voltage detector suitable for detecting a level of an external voltage signal to generate a pre-detection signal;
    a reference voltage generator suitable for generating a reference voltage signal in response to the pre-detection signal;
    a differential amplifier suitable for executing a differential amplification operation between the external voltage signal and the reference voltage signal to generate a first detection signal;
    an internal voltage detector suitable for detecting a level of an internal voltage signal to generate a second detection signal; and
    a signal synthesizer suitable for generating a start signal in response to the first and second detection signals.

14. The semiconductor device of claim 13, wherein a level of the pre-detection signal is changed when a level of the external voltage signal is higher than a first target level.

15. The semiconductor device of claim 14, wherein the first detection signal is enabled with a level transition when a level of the external voltage signal is higher than a level of the reference voltage signal.

16. The semiconductor device of claim 15, wherein the second detection signal is enabled with a level transition when a level of the internal voltage signal is higher than a second target level.

17. The semiconductor device of claim 16, wherein the start signal is enabled when both the first and second detection signals are enabled.

18. The semiconductor device of claim 13, wherein control data includes information for controlling internal operations of a first cell block and information for controlling internal operations of a second cell block.

19. The semiconductor device of claim 18, wherein a boot-up operation stores the information included in the control data to control the internal operations of the first cell block in a first data latch unit and stores the information included in the control data to control the internal operations of the second cell block in a second data latch unit.

20. The semiconductor device of claim 13, wherein the differential amplifier includes:
    a constant current source suitable for supplying a constant current to a first node and a second node, the first detection signal being outputted through the second node;
    a signal input unit suitable for receiving the external voltage signal and the reference voltage signal to set a level of the first node and a level of the second node; and
    an activation unit suitable for discharging electric charges of a third node coupled to the signal input unit to activate a differential amplification operation.

* * * * *